US012796465B2

(12) United States Patent
Kim et al.

(10) Patent No.: US 12,796,465 B2
(45) Date of Patent: Nov. 10, 2026

(54) PACKAGE STRUCTURES FOR EFFICIENT HEAT DISSIPATION

(71) Applicant: TEXAS INSTRUMENTS INCORPORATED, Dallas, TX (US)

(72) Inventors: Woochan Kim, San Jose, CA (US); Ashok Prabhu, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 467 days.

(21) Appl. No.: 18/459,198

(22) Filed: Aug. 31, 2023

(65) Prior Publication Data

US 2025/0079258 A1 Mar. 6, 2025

(51) Int. Cl.

*H10W 40/25* (2026.01)
*H10W 90/00* (2026.01)
*H10W 72/00* (2026.01)
*H10W 72/20* (2026.01)
*H10W 72/30* (2026.01)
*H10W 72/90* (2026.01)

(52) U.S. Cl.

CPC ......... *H10W 40/255* (2026.01); *H10W 90/00* (2026.01); *H10W 72/073* (2026.01); *H10W 72/248* (2026.01); *H10W 72/352* (2026.01); *H10W 72/354* (2026.01); *H10W 72/877* (2026.01); *H10W 72/953* (2026.01); *H10W 90/724* (2026.01); *H10W 90/734* (2026.01); *H10W 90/736* (2026.01)

(58) Field of Classification Search

CPC ........................... H01L 23/373; H10W 40/255
See application file for complete search history.

(56) References Cited

U.S. PATENT DOCUMENTS

2008/0277777 A1* 11/2008 Liao .................... H10W 40/778 257/E23.101
2017/0263588 A1* 9/2017 Chen .................... H10W 70/09
2020/0279790 A1* 9/2020 Yu ........................... H10P 72/74
2023/0170329 A1* 6/2023 Tey ...................... H10W 20/20 257/777

* cited by examiner

*Primary Examiner* — Brent A. Fairbanks
*Assistant Examiner* — Krishna J Palaniswamy
(74) *Attorney, Agent, or Firm* — Dawn Jos; Charles F. Koch

(57) ABSTRACT

In examples, a package comprises a substrate including a conductive member coupled to a conductive terminal, with the conductive terminal exposed to an exterior of the package. The package also includes a first semiconductor die having first device and first non-device sides, with the first device side coupled to the substrate and the first non-device side opposing the first device side, and with the first device side having circuitry formed therein. The package also includes a second semiconductor die having second device and second non-device sides, with the second device side coupled to the substrate and the second non-device side opposing the second device side, and with the second device side having circuitry formed therein. The package also includes first and second adhesive layers contacting the first and second non-device sides, respectively. The package also includes a passivation overcoat (PO) layer contacting the first and second adhesive layers, and a semiconductor layer contacting the PO layer and exposed to an exterior of the package.

22 Claims, 22 Drawing Sheets

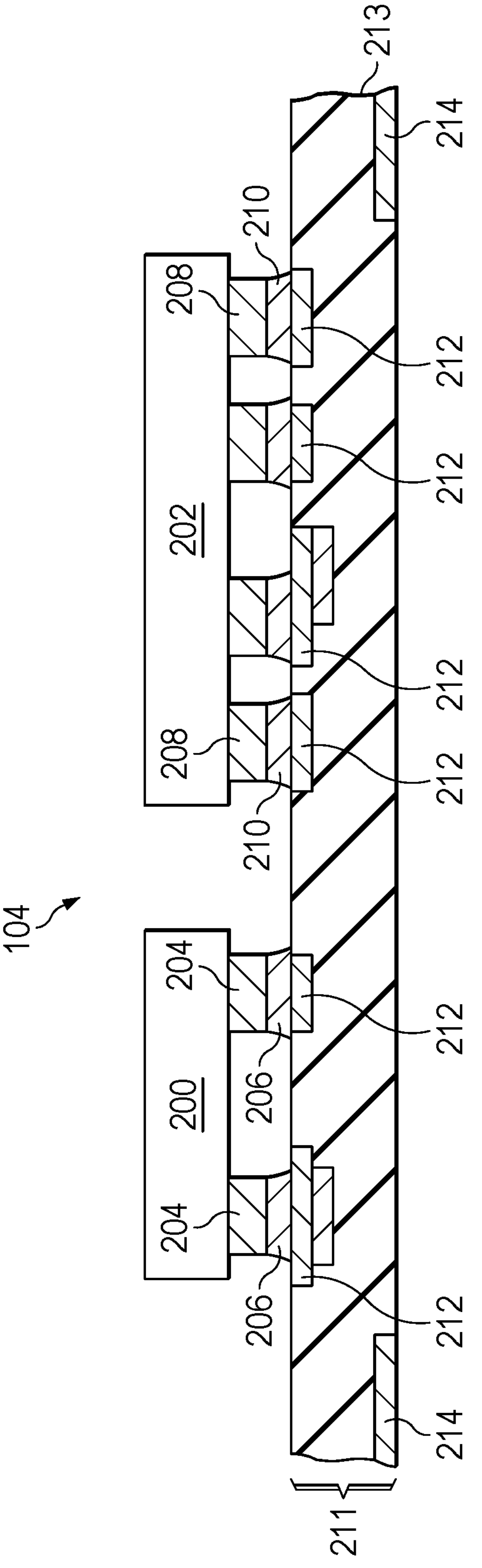
FIG. 5A1

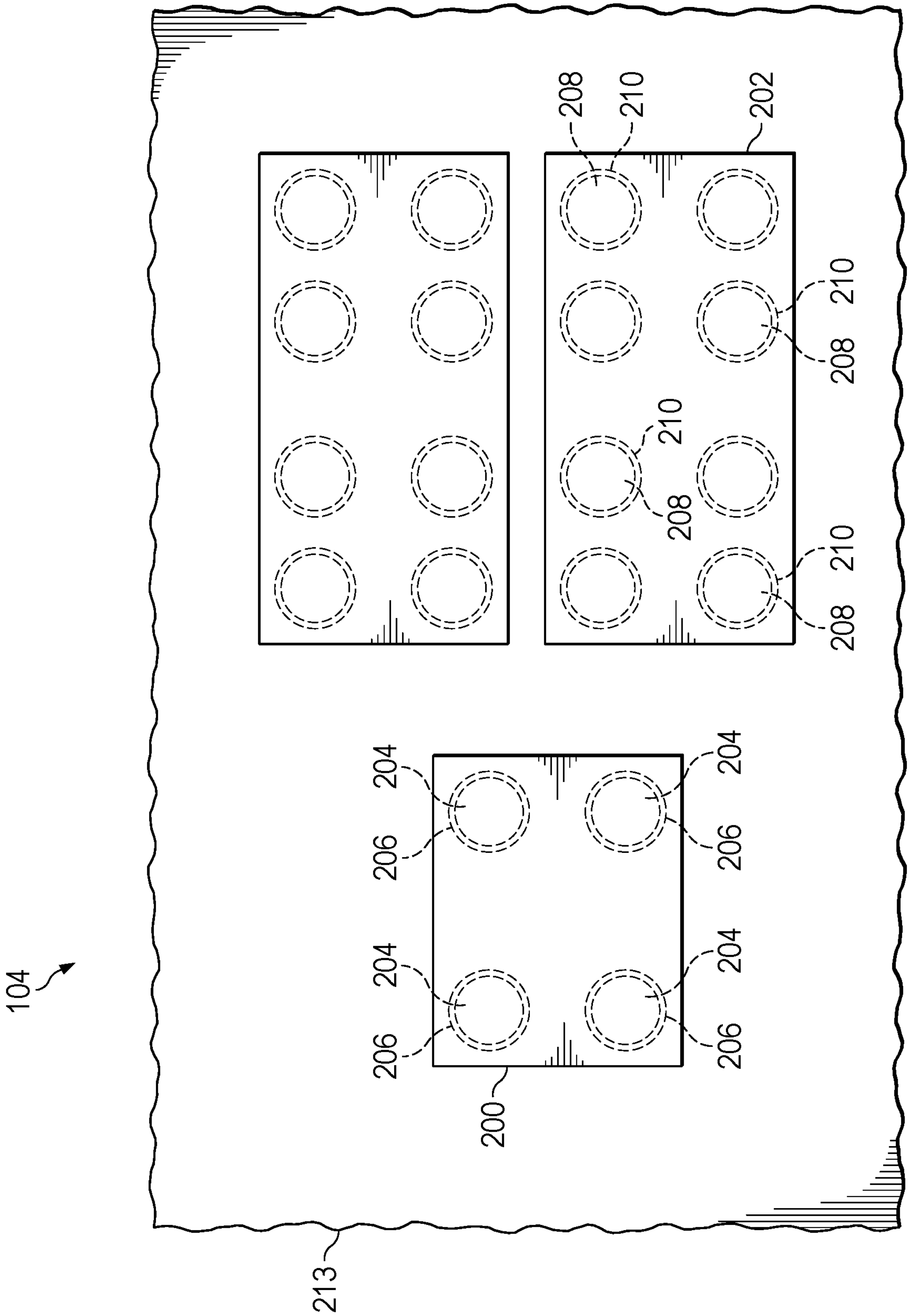
FIG. 5A2

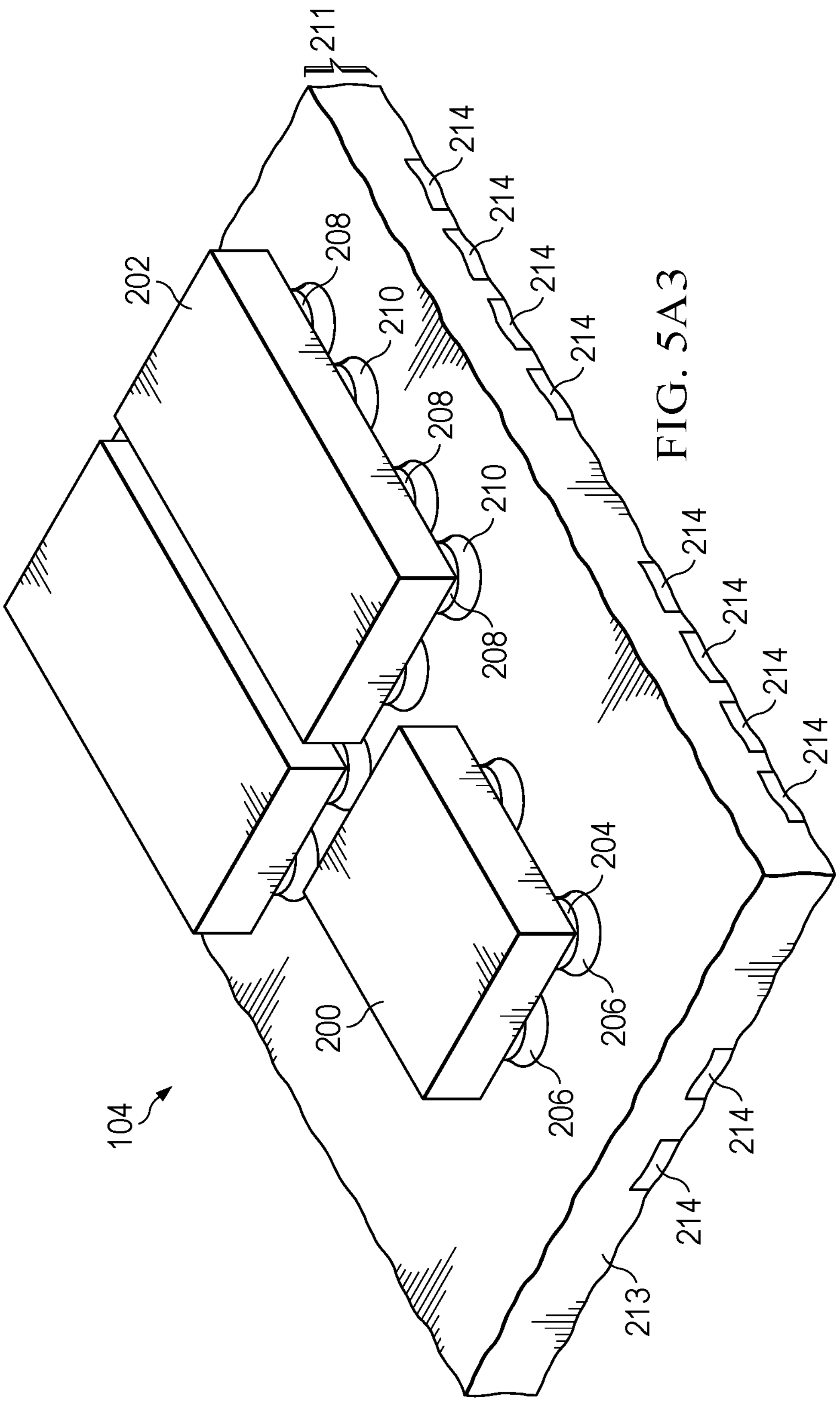
FIG. 5A3

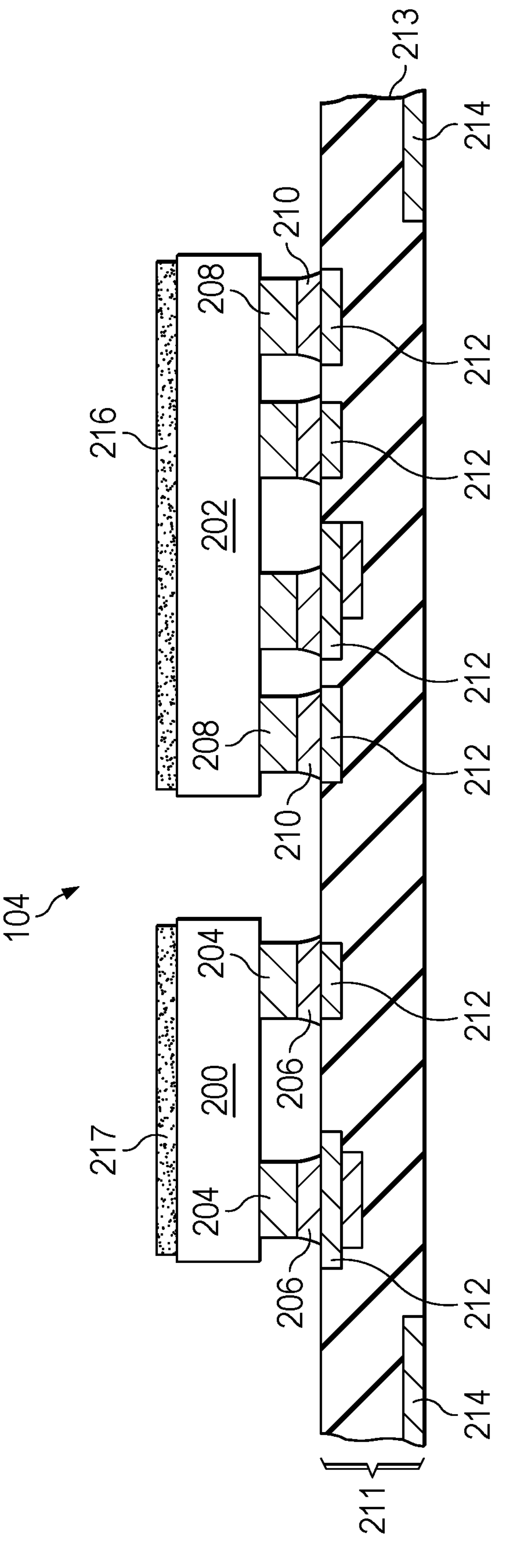
FIG. 5B1

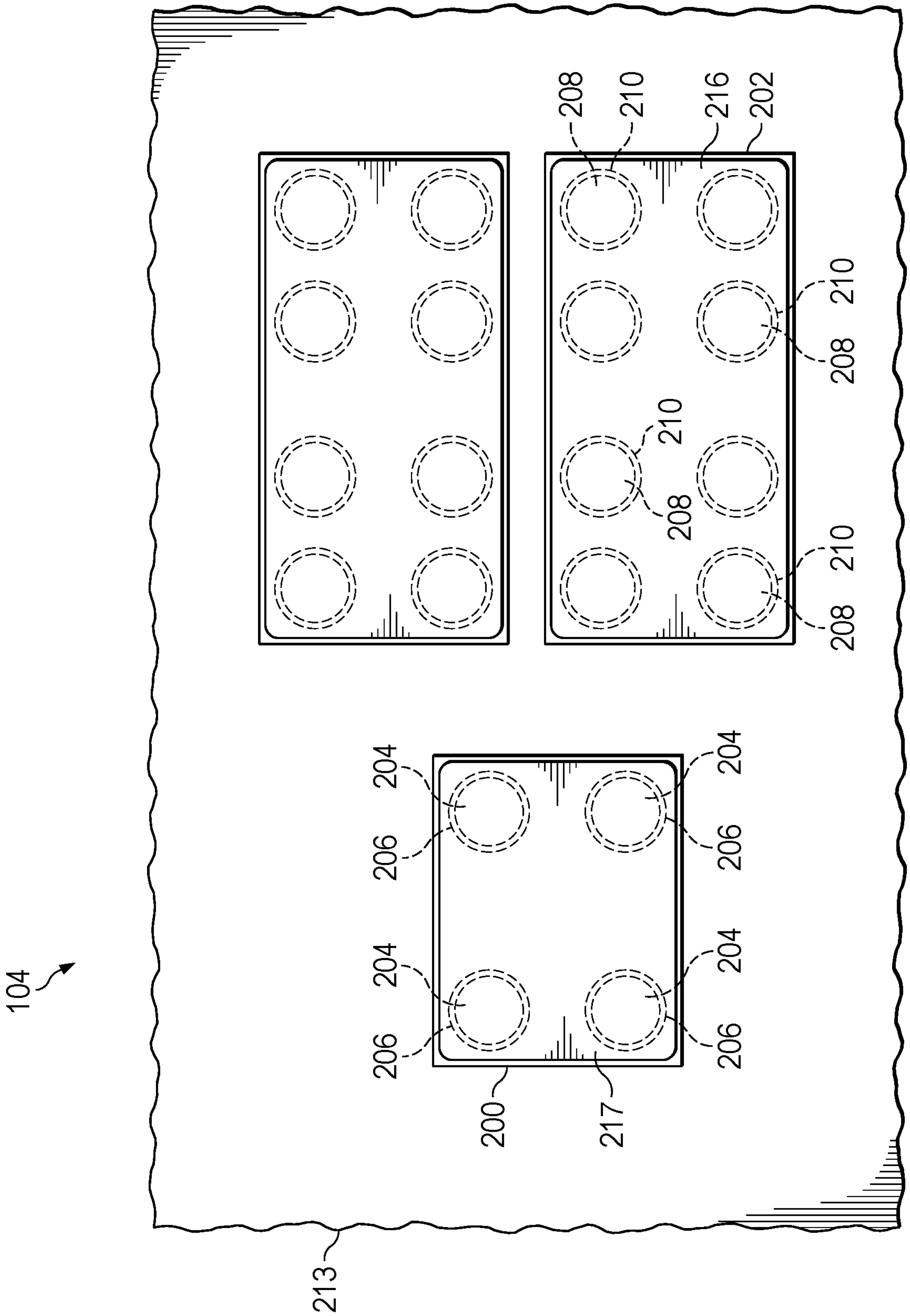
FIG. 5B2

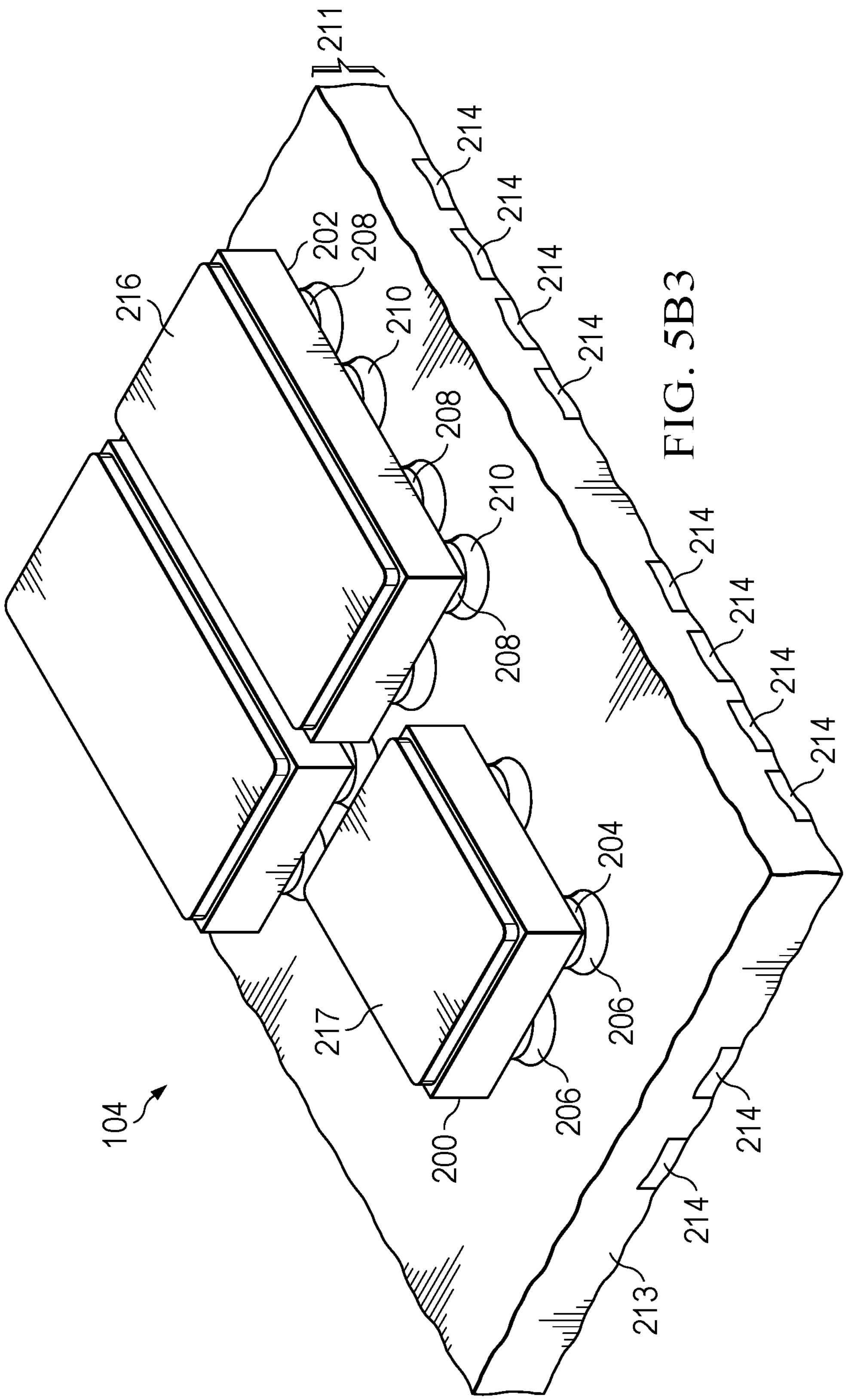
FIG. 5B3

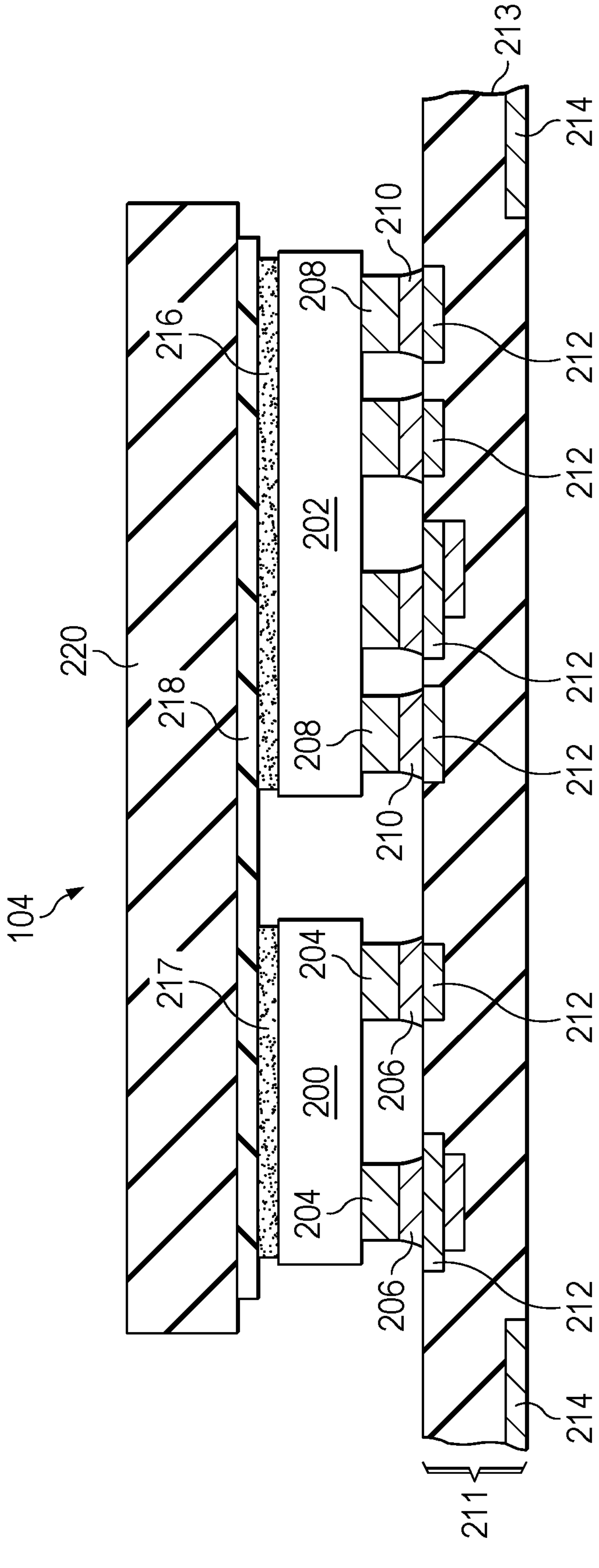
FIG. 5C1

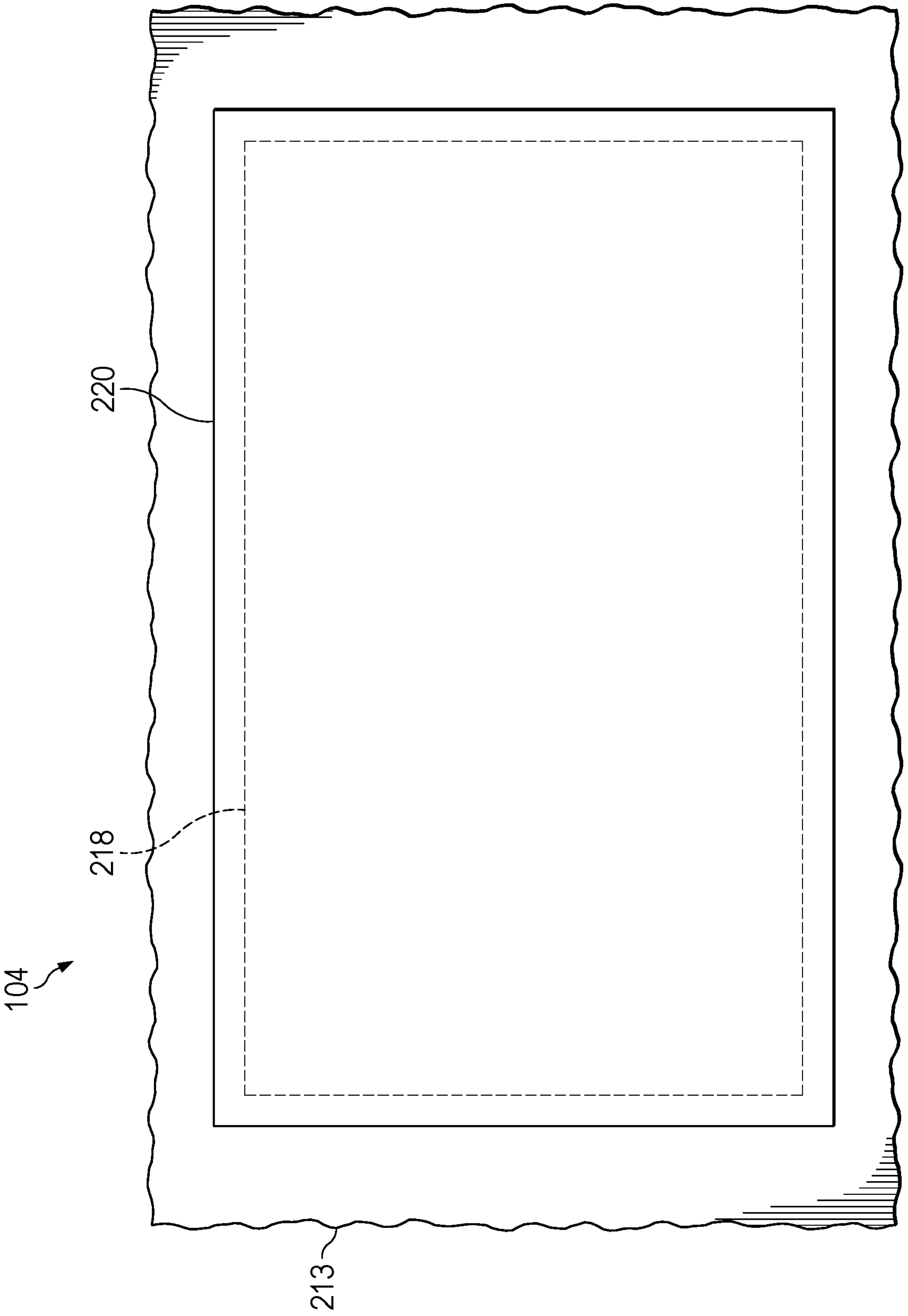
FIG. 5C2

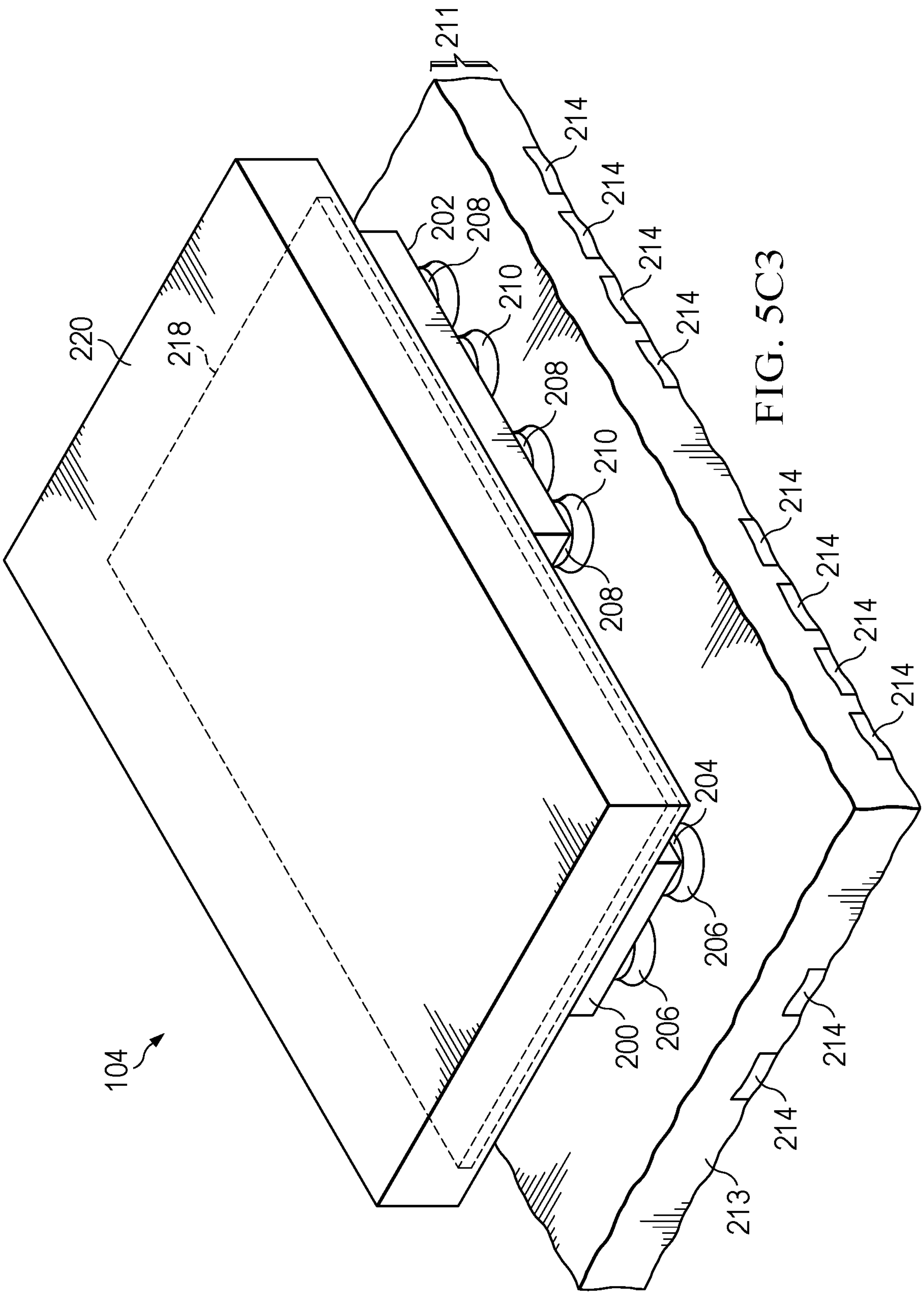
FIG. 5C3

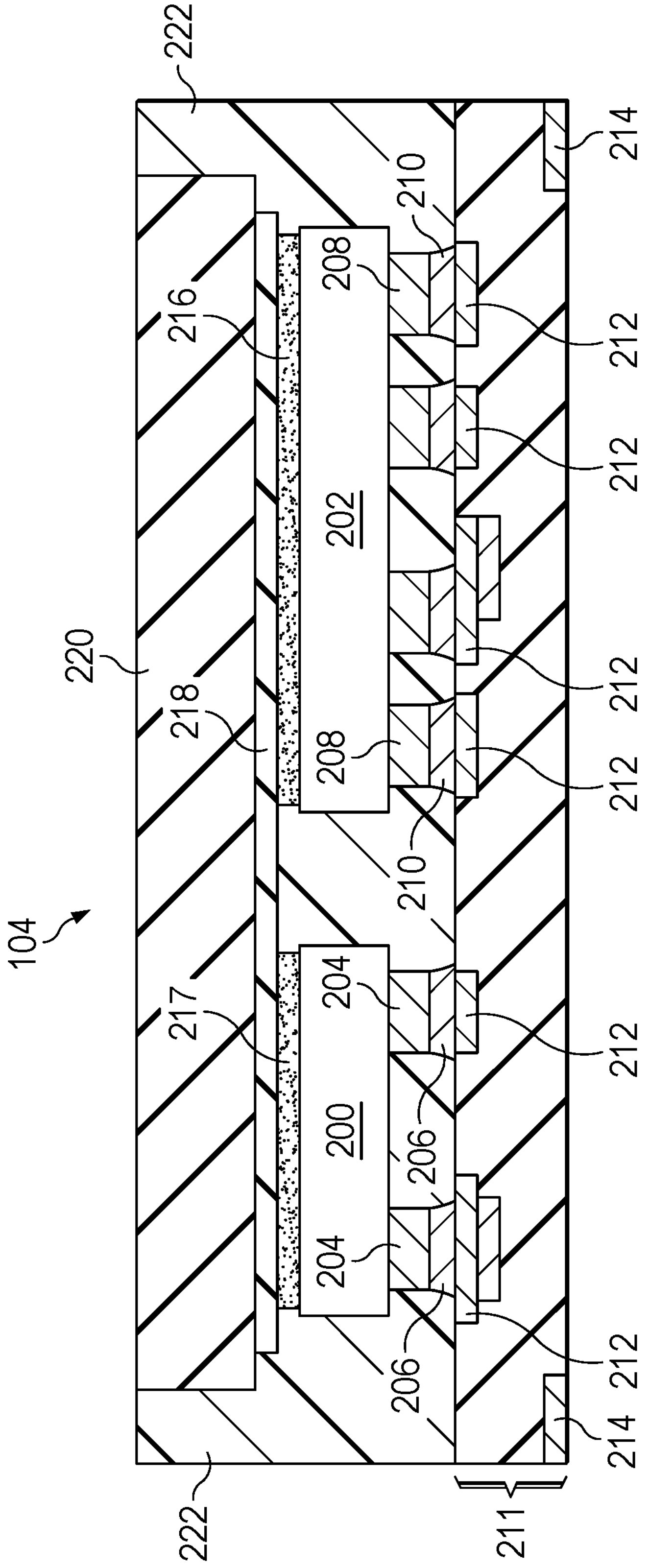
FIG. 5D1

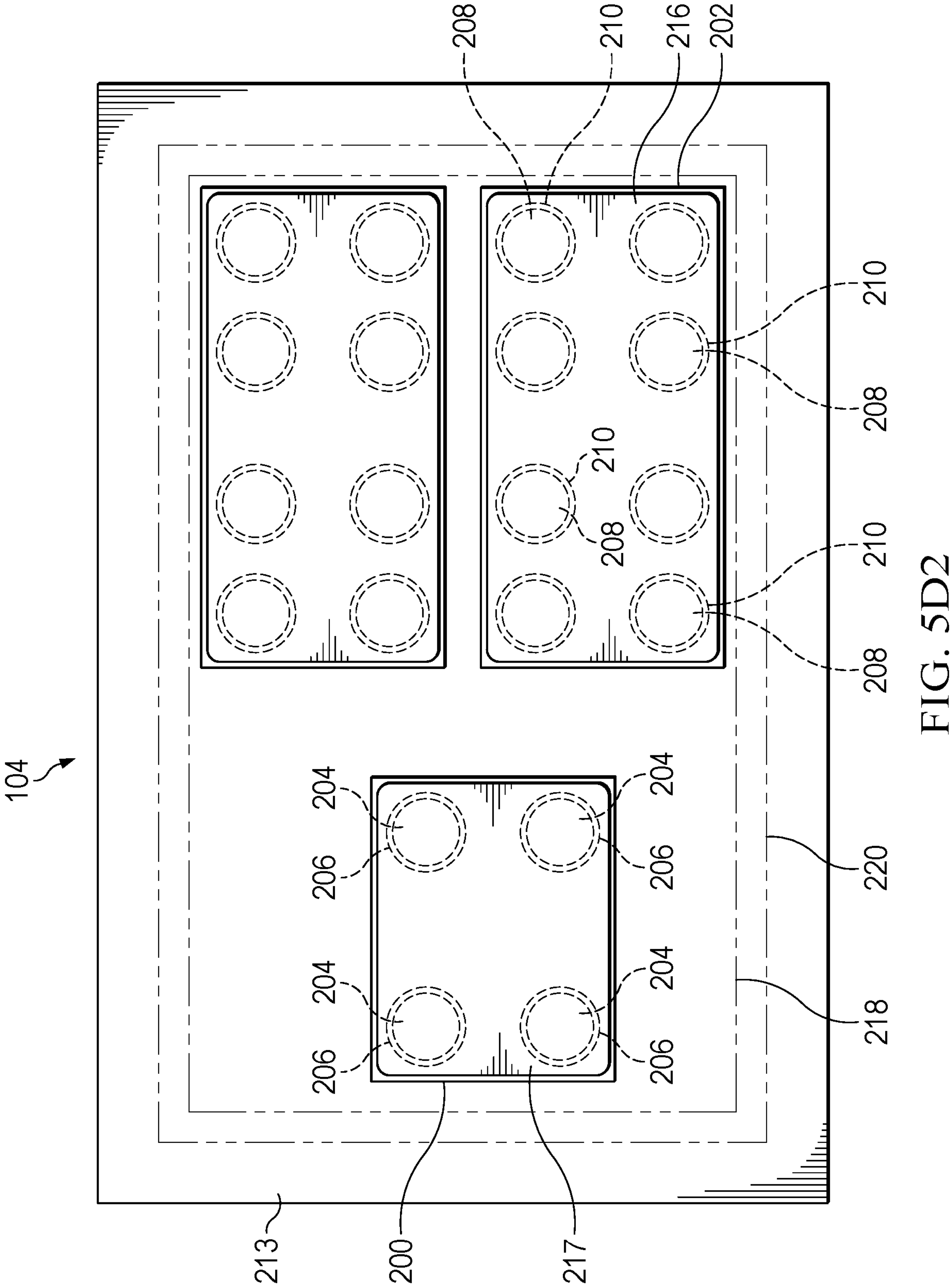
FIG. 5D2

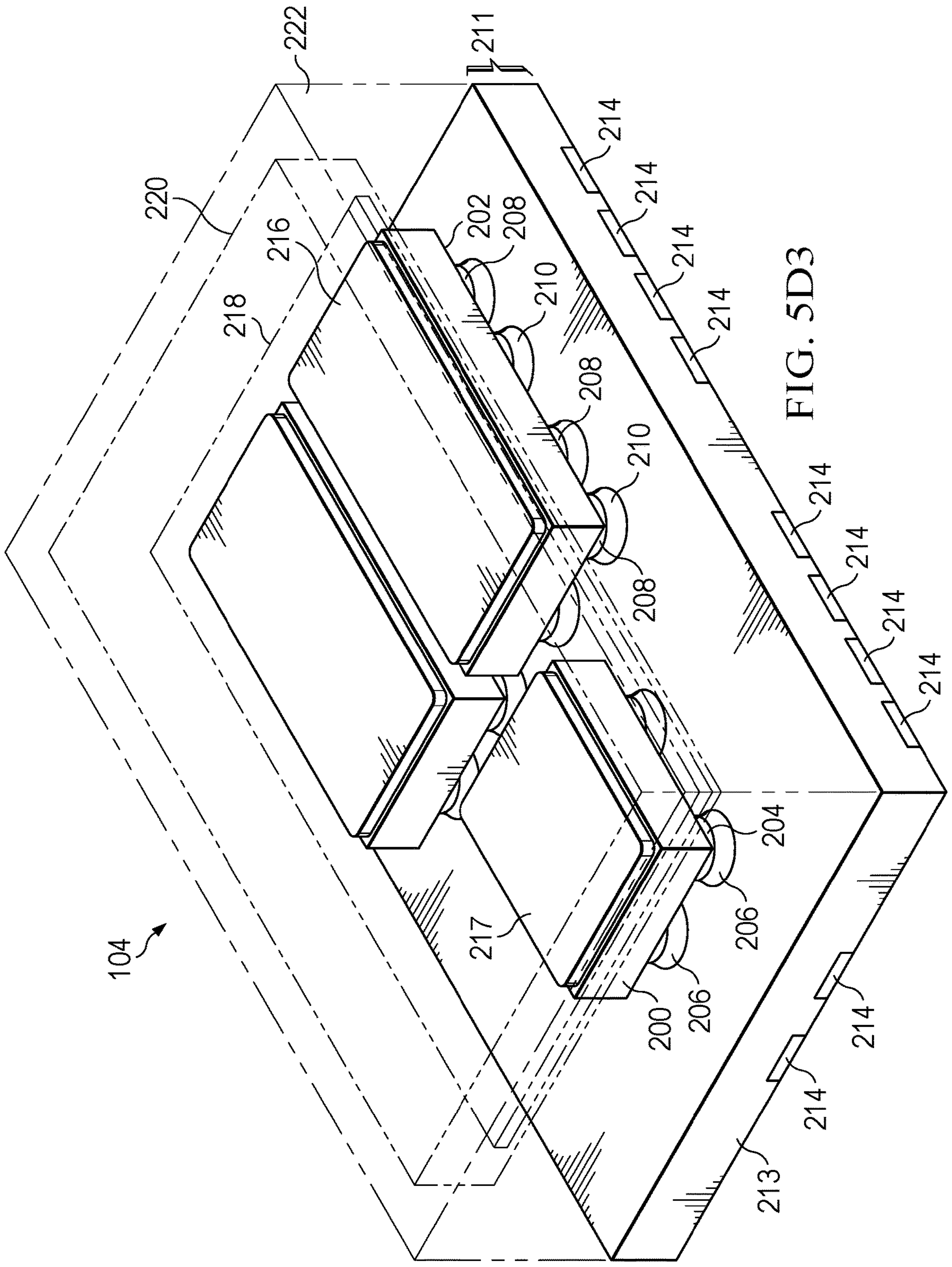
FIG. 5D3

PACKAGE STRUCTURES FOR EFFICIENT HEAT DISSIPATION

BACKGROUND

Semiconductor wafers are circular pieces of semiconductor material, such as silicon, that are used to manufacture semiconductor chips. Generally, complex manufacturing processes are used to form numerous integrated circuits on a single wafer. The formation of such circuits on a wafer is called fabrication. After wafer fabrication, the wafer is cut into multiple pieces, called semiconductor dies, with each die containing one of the circuits. The cutting, or sawing, of the wafer into individual dies is called singulation. Dies may then be coupled to lead frames, covered by a mold compound, and sawn into individual packages.

SUMMARY

In examples, a package comprises a substrate including a conductive member coupled to a conductive terminal, with the conductive terminal exposed to an exterior of the package. The package also includes a first semiconductor die having first device and first non-device sides, with the first device side coupled to the substrate and the first non-device side opposing the first device side, and with the first device side having circuitry formed therein. The package also includes a second semiconductor die having second device and second non-device sides, with the second device side coupled to the substrate and the second non-device side opposing the second device side, and with the second device side having circuitry formed therein. The package also includes first and second adhesive layers contacting the first and second non-device sides, respectively. The package also includes a passivation overcoat (PO) layer contacting the first and second adhesive layers, and a semiconductor layer contacting the PO layer and exposed to an exterior of the package.

In examples, a method of manufacturing a package comprises coupling a device side of a semiconductor die to a substrate, with the device side having circuitry formed therein, and with the substrate including a conductive terminal exposed to an exterior of the substrate. The method comprises applying an adhesive layer on a non-device side of the die opposing the device side of the die. The method also includes applying a passivation overcoat (PO) layer on the adhesive layer, with a semiconductor layer in contact with the PO layer. The method also includes covering the substrate, the semiconductor die, the PO layer, and the semiconductor layer with a mold compound, with a top surface of the semiconductor layer exposed to a top surface of the mold compound.

BRIEF DESCRIPTION OF THE DRAWINGS

FIGS. 5A1-5D3 are a process flow for manufacturing a package with structures providing efficient heat dissipation, in accordance with various examples.

DETAILED DESCRIPTION

Figure 1:
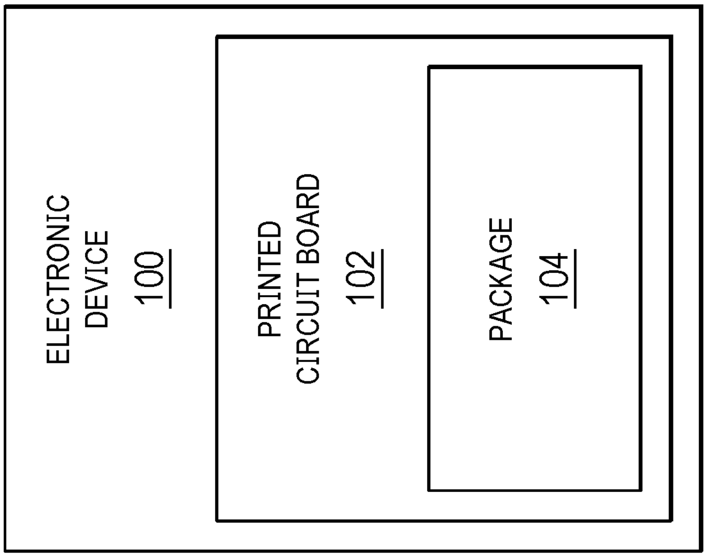
FIG. 1 is a block diagram of an electronic device containing a package with structures providing efficient heat dissipation, in accordance with various examples.

Semiconductor dies generate significant amounts of heat. For example, some dies may be used as high-side or low-side field effect transistor (FET) switches, and the rapid switching action of such switches, along with high currents passing through the switches, can generate substantial heat. Other types of dies, such as those including controller circuitry, can also generate substantial heat during operation. Dissipating this heat from a package can be challenging, because the die inside the package is covered by mold compound and may be surrounded by various other package components. If not removed from the package, the heat can compromise the structural and functional integrity of the package. In some cases, heat levels are not sufficiently high so as to cause damage to the package, but reducing heat is nevertheless useful because technical advantages, such as compensating increases in die power and performance, or compensating decreases in die and package size, can be realized.

Some solutions entail the use of a metal heat sink coupled to the non-device side of a die. The heat sink is coupled to the die through a thermal interface material (TIM). Such solutions present numerous technical disadvantages and challenges. First, the size of the die limits how much of the heat sink can be used for heat dissipation. This is because the TIM has poor thermal conductivity (e.g., 1-10 Watts per meter-Kelvin) and significant thickness (approximately 500 microns). Second, expanding the size of the die to increase the area of contact between the die and the TIM is not a feasible way to increase heat dissipation, as increasing die size is inefficient, cost prohibitive, and occupies excessive space. Third, the combination of the TIM and the heat sink is adequately electrically conductive such that it cannot be coupled to multiple dies in the package, lest the dies establish electrical contact with each other, resulting in an electrical short and functional damage. Thus, if there are multiple dies in a package that are generating heat, only one of the dies can be coupled to the heat sink for thermal dissipation.

This disclosure describes various examples of a package having structures for efficient heat dissipation. In some examples, a package comprises a substrate including a conductive member coupled to a conductive terminal. The conductive terminal is exposed to an exterior of the package.

The package also comprises a first semiconductor die having first device and first non-device sides, where the first device side is coupled to the substrate and the first non-device side opposes the first device side. The first device side has circuitry formed therein. The package also includes a second semiconductor die having second device and second non-device sides. The second device side is coupled to the substrate and the second non-device side opposes the second device side. The second device side has circuitry formed therein. The package includes first and second adhesive layers contacting the first and second non-device sides, respectively. The package comprises a passivation overcoat (PO) layer contacting the first and second adhesive layers. The package includes a semiconductor layer contacting the PO layer and exposed to an exterior of the package.

FIG. 1 is a block diagram of an electronic device 100 containing a package with structures providing efficient heat dissipation, in accordance with various examples. More specifically, the electronic device 100 includes a printed circuit board (PCB) 102 on which a semiconductor package 104, such as a semiconductor package including structures providing efficient heat dissipation, is mounted. The electronic device 100 may be any suitable type of device, such as a computer (e.g., laptop, desktop, notebook, tablet, smartphone), a consumer electronic device (e.g., television, audio devices, security systems), appliances, automobiles, aircraft, spacecraft, etc., although the scope of this disclosure is not limited as such, and the semiconductor package 104 may be useful in any of a variety of contexts not expressly mentioned herein.

Figure 2A:
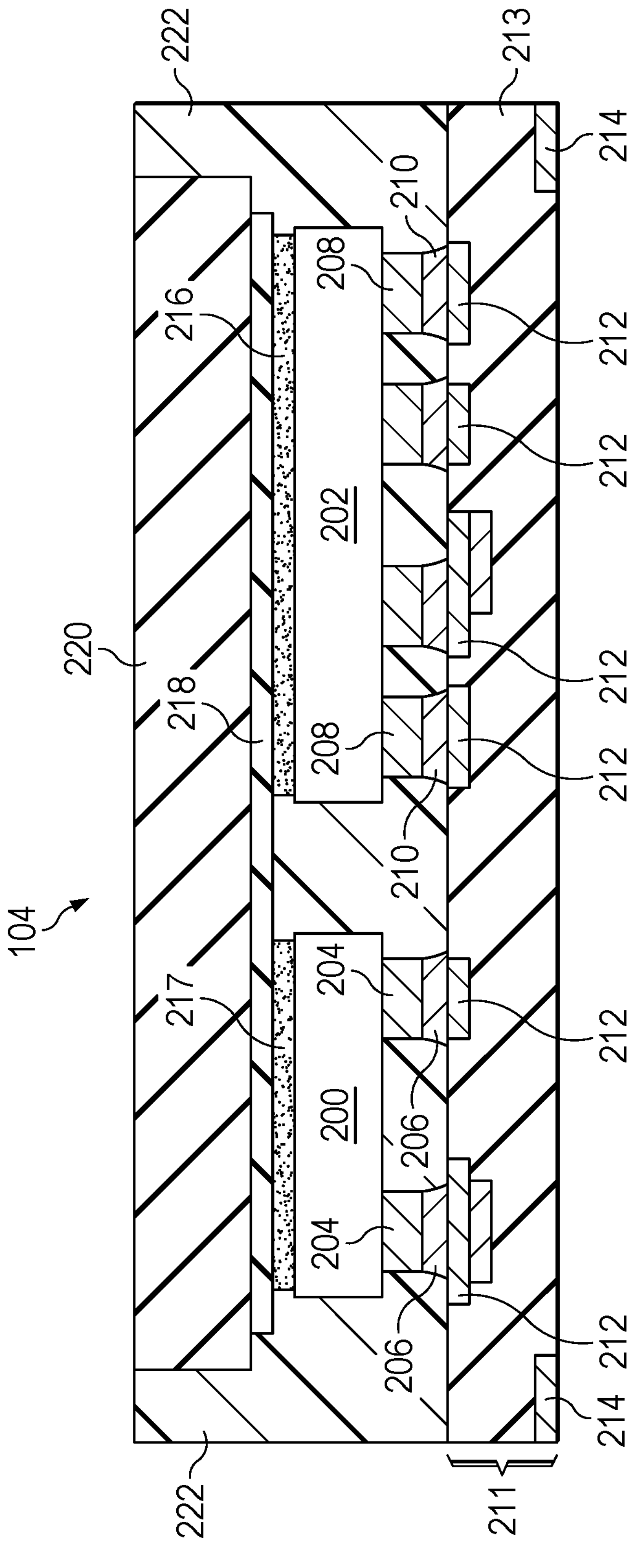
FIG. 2A is a profile, cross-sectional view of a package with structures providing efficient heat dissipation, in accordance with various examples.
Figure 2B:
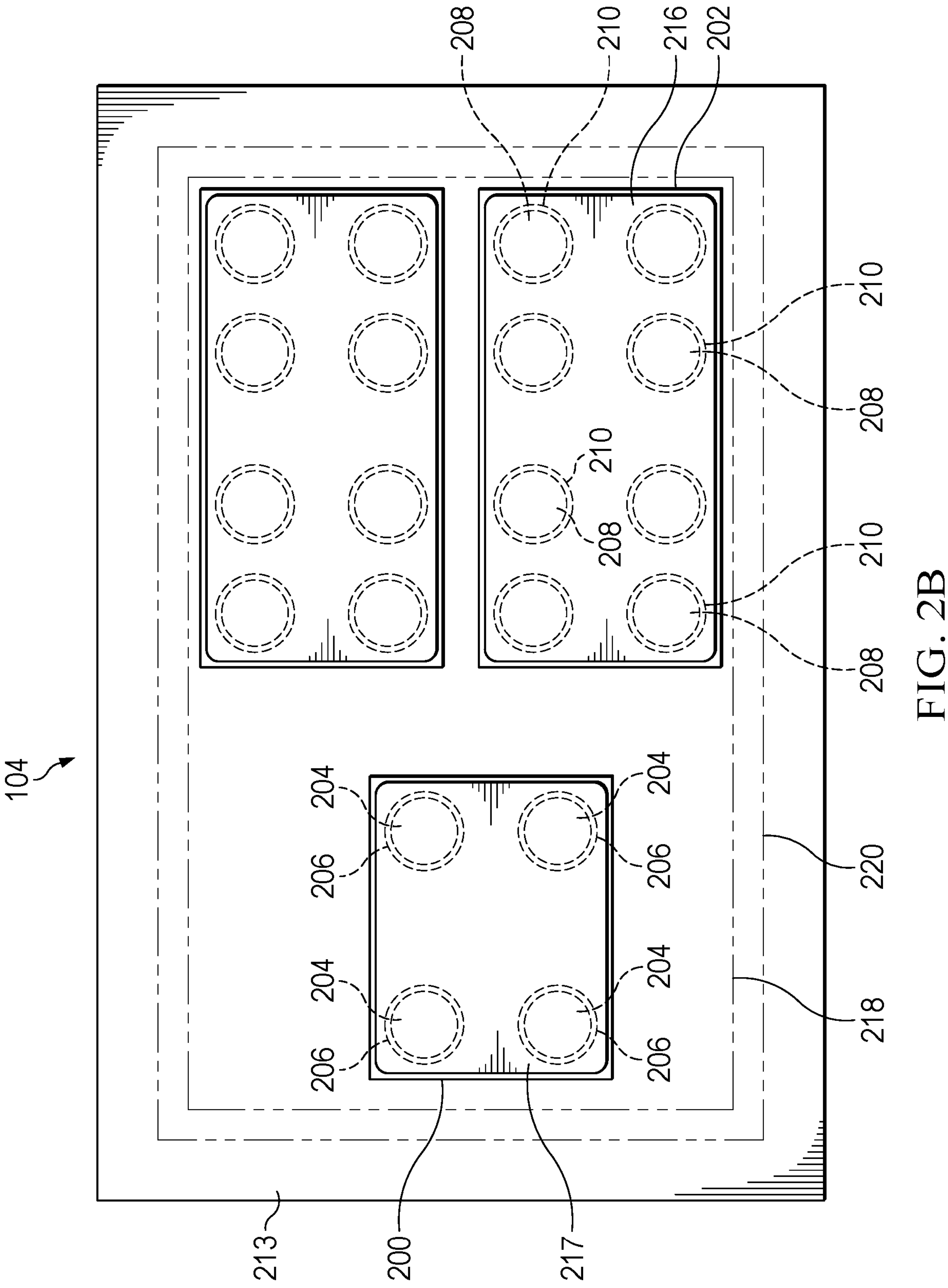
FIG. 2B is a top-down view of a package with structures providing efficient heat dissipation, in accordance with various examples.

FIG. 2A is a profile, cross-sectional view of a semiconductor package 104 with structures providing efficient heat dissipation, in accordance with various examples. The example semiconductor package 104 includes semiconductor dies (sometimes referred to as "dies") 200 and 202. The semiconductor package 104 may include additional dies, an example of which is shown in FIG. 2B. The description provided herein with reference to dies 200 and 202 also applies to other die(s) that may be included in the semiconductor package 104. The dies 200 and 202 may be of any suitable type and may be configured to perform any of a variety of operations. In examples, the dies 200, 202 may be gallium nitride FET dies, such as high-side FET or low-side FET switches. The dies 200, 202 may be useful in power applications. The dies 200, 202 may contain controller circuitry and may comprise silicon and/or gallium nitride controller dies. For example, the die 200 may be a gallium nitride or silicon controller die configured to control an operation (e.g., switching action) of the die 202, which may be a gallium nitride or silicon die. The dies 200, 202 may perform the same or different operations and may contain the same or different types of semiconductor materials (e.g., silicon, gallium nitride).

The dies 200, 202 include device sides and non-device sides. The device sides of the dies 200, 202 include circuitry formed on and/or in the device sides. The non-device sides do not contain circuitry and oppose the device sides. In FIG. 2A, the dies 200, 202 are oriented so the device sides of these dies are facing downward, and the non-device sides are facing upward.

The device sides of the dies 200, 202 are coupled to metal posts 204 and 208, respectively. Each of the dies 200, 202 may be coupled to multiple such metal posts. The metal posts 204, 208 may couple to the circuitry of the dies 200, 202, respectively. Solder bumps 206, 210 couple metal posts 204, 208 to a network of conductive members 212 that are within a substrate 211. The network of conductive members 212 couples to conductive terminals 214, which are exposed to one or more exterior surfaces of the semiconductor package 104. In this way, electrical pathways are established between the circuitry of the dies 200, 202 to the conductive terminals 214. Not all portions of the conductive terminals 214 are visible in the drawings, as the conductive terminals 214 extend in various directions and not all such directions are visible in cross-sectional slices. Further, the substrate 211 is depicted as being opaque in at least FIGS. 2B and 2C, to facilitate ease of understanding. The substrate 211 includes an insulative material 213 (e.g., AJINOMOTO® build-up film (ABF)) that covers the network of conductive terminals 214.

The dies 200, 202 may be solder bumped and grinded such that the non-device sides (i.e., surfaces) of the dies 200, 202 are horizontally co-planar. Stated another way, the non-device sides (i.e., surfaces) of the dies 200, 202 have the same heights relative to the top surface of the substrate 211. This is achieved by controlling the thicknesses of the solder bumps 206, 210 to be the same; the thicknesses of the metal posts 204, 208 to be the same; and the thicknesses of the dies 200, 202 to be the same. Alternatively, the various thicknesses of these structures may vary, but the combined thickness of each set of solder bumps, metal posts, and dies may still be the same as the combined thickness of another set of solder bumps, metal posts, and dies.

In examples, the semiconductor package 104 includes adhesive layers 216, 217. The adhesive layer 216 contacts the non-device side of the die 202. The adhesive layer 217 contacts the non-device side of the die 200. The adhesive layers 216, 217 may comprise any suitable thermally conductive adhesive. It is preferable that the adhesive layers 216, 217 are highly thermally conductive and minimally electrically conductive. In examples, the adhesive layers 216 and/or 217 are a thermally conductive epoxy material, solder, or a silver sintering material. The adhesive layer 216 may be different from the adhesive layer 217. The thickness of each adhesive layer 216, 217 ranges from 10 microns to 50 microns, with a thickness below this range being disadvantageous because it is unacceptably difficult to use the adhesive layers to compensate for thickness variations in the die stacks of the package 104 (e.g., a stack including the die 200, metal posts 204, solder bumps 206, etc.; a stack including the die 202, metal posts 208, solder bumps 210, etc.; and so on), and with a thickness above this range being disadvantageous because of the resulting thermal degradation within the package 104.

The semiconductor package 104 includes a heat dissipation member (HDM) 218. The HDM 218 contacts both of the adhesive layers 216, 217, as well as any other adhesive layers that may be present in the semiconductor package 104 and contacting a die in the semiconductor package 104. However, in some examples, multiple HDMs 218 may be used, with each HDM 218 contacting at least one adhesive layer within the semiconductor package 104. The remainder of this description assumes the inclusion of a single HDM 218, although the scope of this disclosure is not limited as such. The HDM 218 may be a passivation overcoat (PO) layer, such as silicon nitride, silicon oxide, silicon dioxide, polymer films, silicon oxynitride, and other suitable materials. The HDM 218 preferably has high thermal conductivity and minimal electrical conductivity. The thickness of the HDM 218 critically ranges between 1 micron and 4 microns, depending on the electrical isolation voltage (and the electrical resistivity) required to electrically isolate the dies 200, 202 from each other. If only one die in the semiconductor package 104 is coupled to the HDM 218, the HDM 218 may have a thickness at the lower end of the critical range, such as 1 micron. If multiple dies in the semiconductor package 104 are coupled to the HDM 218, presenting a risk of shorting between the dies, the thickness of the HDM 218 may be at the upper end of the critical range, such as at 3 microns or 4 microns. Compared to TIMs as described above, which are typically about 500 microns thick, an HDM 218 that is between 1 and 4 microns thick presents significantly greater thermal conductivity.

The semiconductor package 104 includes a heat dissipation member (HDM) 220. The HDM 220 contacts the HDM 218. If multiple HDMs 218 are present, the HDM 220 contacts one or more such HDMs 218. In examples, the semiconductor package 104 includes multiple HDMs 220. In such examples, each HDM 220 contacts one or more HDMs 218. The remainder of this description assumes the inclusion of a single HDM 220, although the scope of this disclosure is not limited as such. The HDM 220 may be a bulk (i.e., devoid of other non-semiconductor materials formed or deposited) semiconductor material, such as silicon or gallium nitride. If the HDM 220 is a semiconductor material, its electrical conductivity is relatively low, while its thermal conductivity remains relatively high (at least 150 Watts per meter-Kelvin (W/m-K). This enables the HDM 220 to effectively and efficiently dissipate heat, while helping maintain electrical isolation between the dies (e.g., dies 200, 202). In examples where the semiconductor package 104 only includes one die, or where the HDM 220 couples to only one die, the HDM 220 may be a metal, such as copper or aluminum, with high thermal and electrical conductivity. The increased electrical conductivity does not pose a risk to electrical isolation between the dies of the semiconductor package 104 because the HDM 220 in such an example couples only to a single die.

Still referring to FIG. 2A, in operation, the dies 200, 202 generate heat during operation. At least some of this heat is transferred to the adhesive layers 216, 217. The adhesive layers 216, 217 are strong conductors of heat and transfer the heat to the HDM 218. The HDM 218 is thin, within the critical thickness range of 1 micron to 4 microns as described above. Thus, the heat transfers efficiently through the HDM 218 to the HDM 220. The HDM 220 is a strong conductor of heat and thus radiates the heat into the atmosphere of the semiconductor package 104. Because the HDM 218 is so thin and thus efficiently conducts heat, and because the HDM 220 is a strong conductor of heat, the heat generated by a die with even a small non-device side surface area can spread across most or all of the HDMs 218 and 220, thus providing more effective and efficiently cooling of the dies 200, 202. Furthermore, because the HDMs 218, 220 are not strong electrical conductors, and because the HDM 218 is adequately thick, the dies 200, 202 maintain their respective electrical isolation, as is the case for any other dies that may be present within the semiconductor package 104.

Figure 2C:
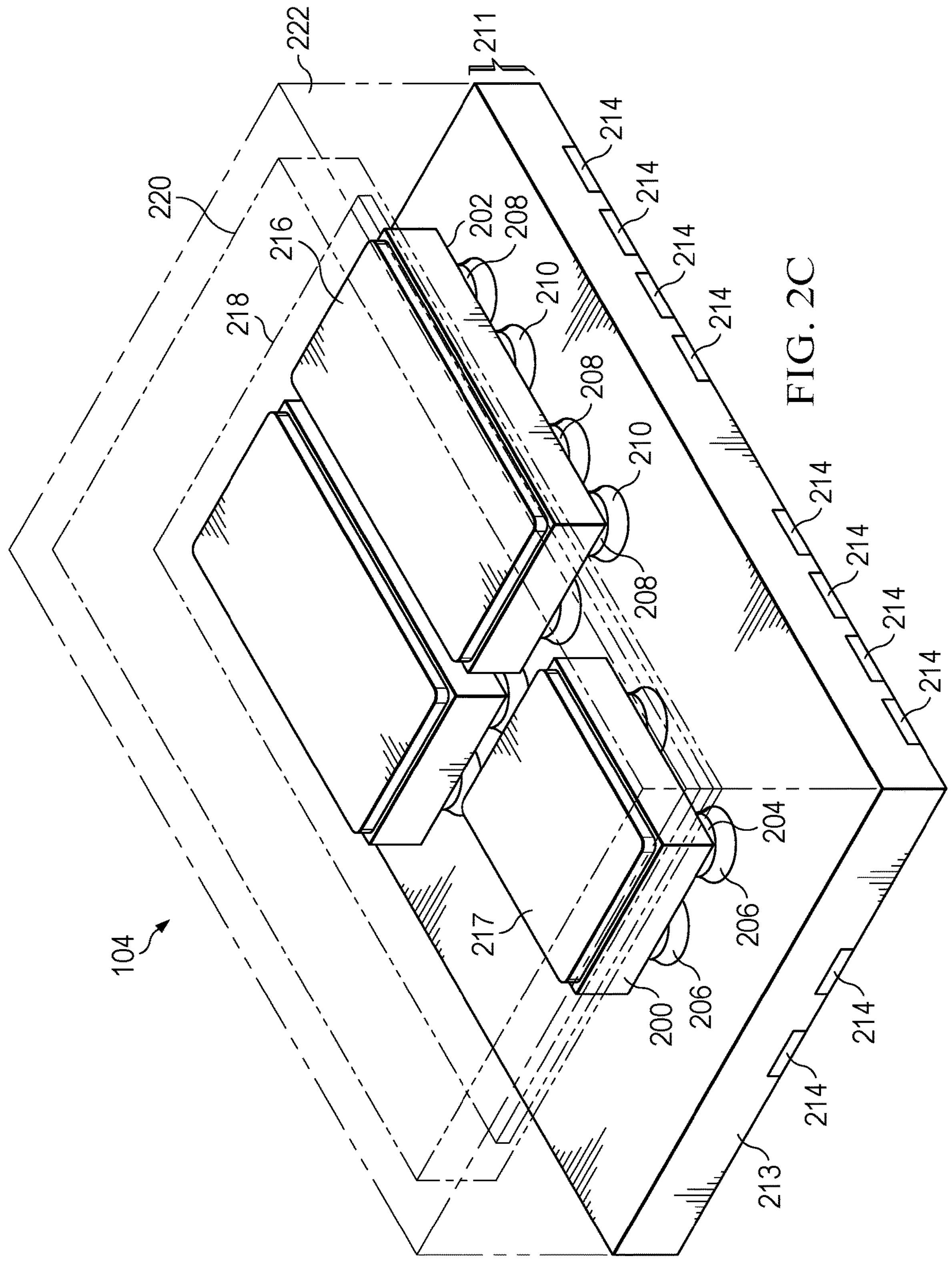
FIG. 2C is a perspective view of a package with structures providing efficient heat dissipation, in accordance with various examples.
Figure 2D:
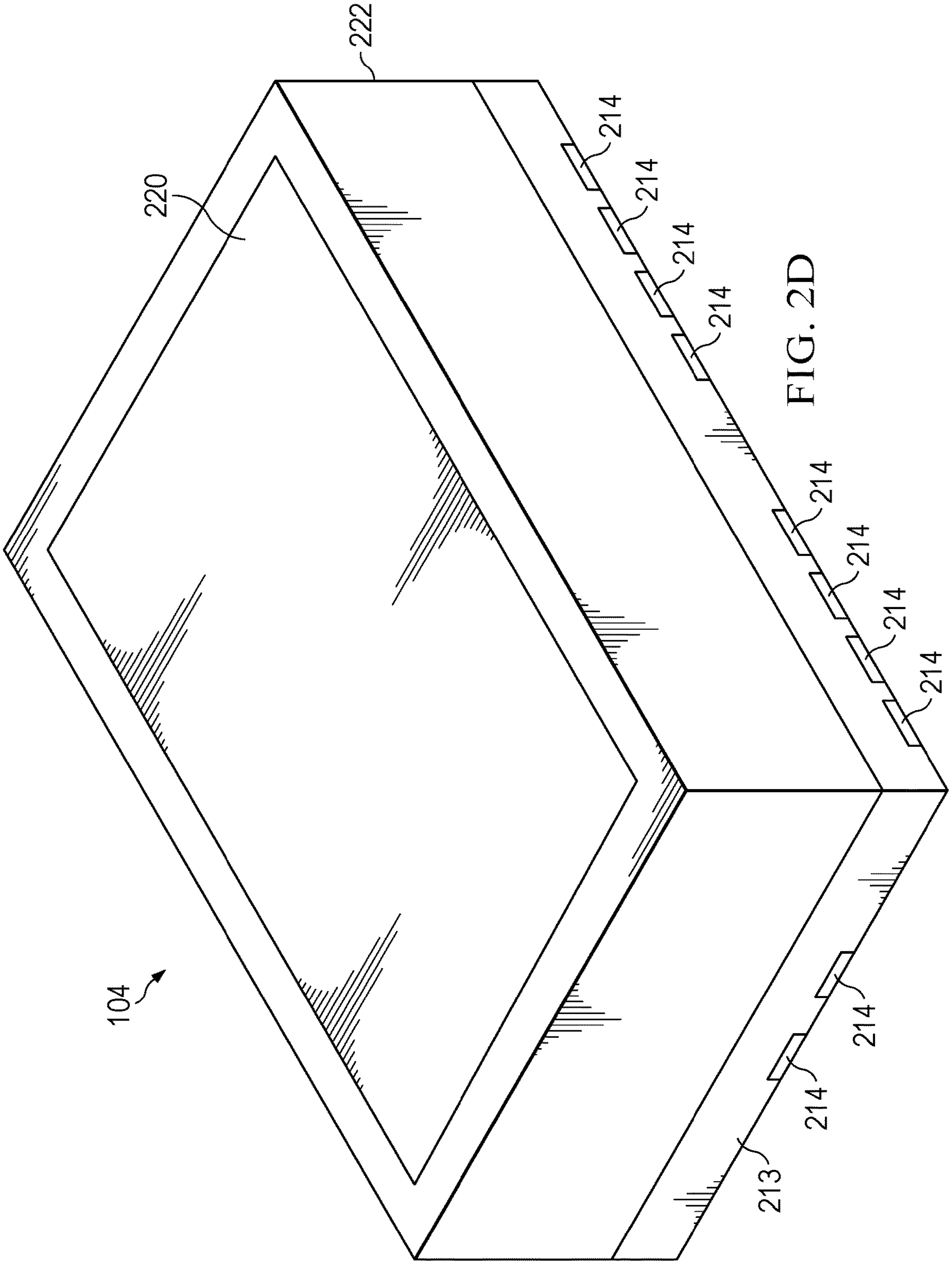
FIG. 2D is another perspective view of a package with structures providing efficient heat dissipation, in accordance with various examples.

FIG. 2B is a top-down view of the semiconductor package 104 of FIG. 2A, in accordance with various examples. The semiconductor package 104 includes a third die, as shown, and this third die may be configured similarly to the dies 200, 202 as described above. Any number of dies may be included in the semiconductor package 104. In FIG. 2B, the substrate 211 is opaque to facilitate ease of understanding. FIG. 2C is a perspective view of the semiconductor package 104 of FIG. 2A, in accordance with various examples. In FIG. 2C, the substrate 211 is opaque to facilitate ease of understanding. FIG. 2D is another perspective view of the semiconductor package 104 of FIG. 2A, in accordance with various examples.

Figure 3A:
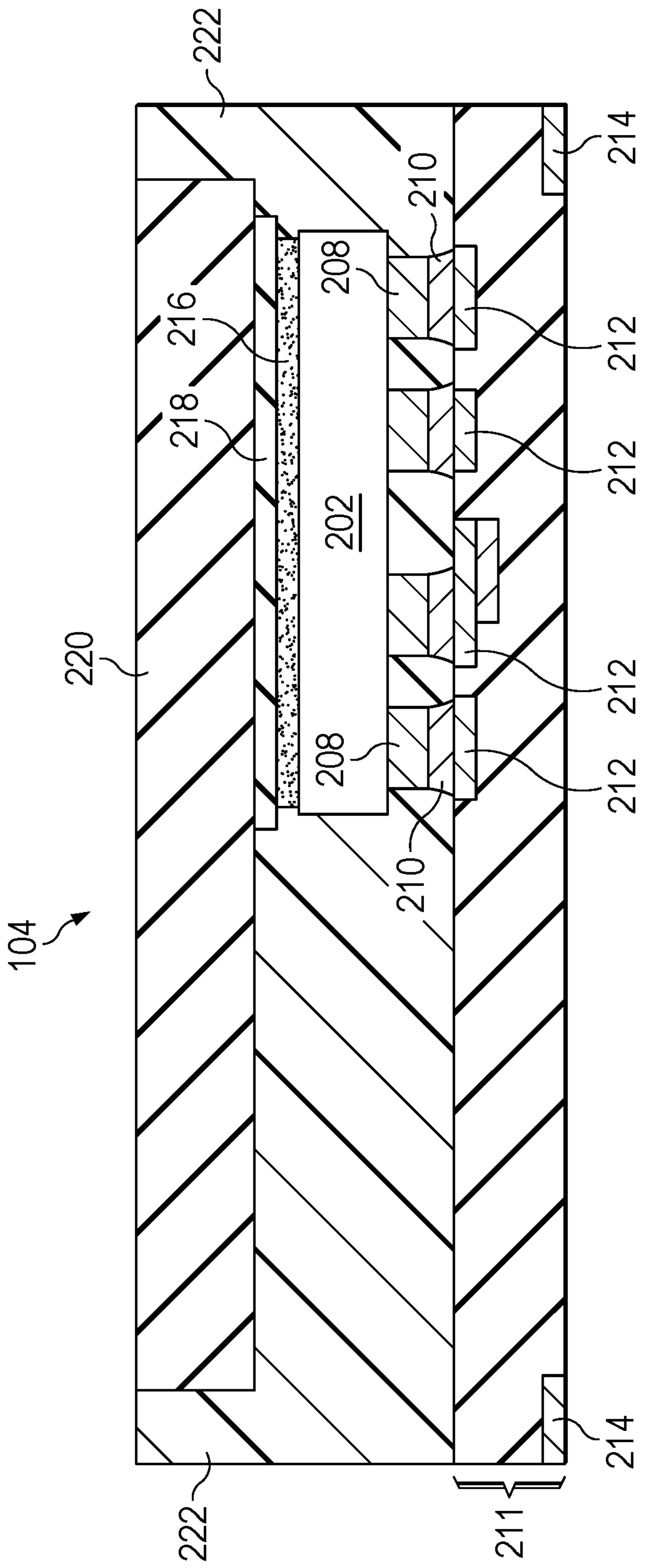
FIG. 3A is a profile, cross-sectional view of a package with structures providing efficient heat dissipation, in accordance with various examples.

FIG. 3A is a profile, cross-sectional view of a semiconductor package 104 with structures providing efficient heat dissipation, in accordance with various examples. The semiconductor package 104 may be identical to the semiconductor package 104 shown in FIGS. 2A-2D, except that the semiconductor package 104 contains only one die 202. In such examples, the area of the HDM 218 is reduced, as shown. Further, in such examples, it is advantageous to position the die 202 centrally or approximately centrally under the HDM 220, so that as much of the HDM 220 surface area as possible is available to the die 202 to maximize heat dissipation from the die 202. However, it is also possible for the die 202 to be placed non-centrally under the HDM 220, as shown in FIG. 3A. Because only one die 202 is included in the semiconductor package 104, the die 202 does not require electrical isolation from any other dies. Accordingly, the HDM 218 may be as thin as 1 micron to facilitate heat dissipation from the die 202. Further, the HDM 220 may be metallic to facilitate heat dissipation from the HDM 218, as electrical isolation between multiple dies is not a concern in this example.

Figure 3B:
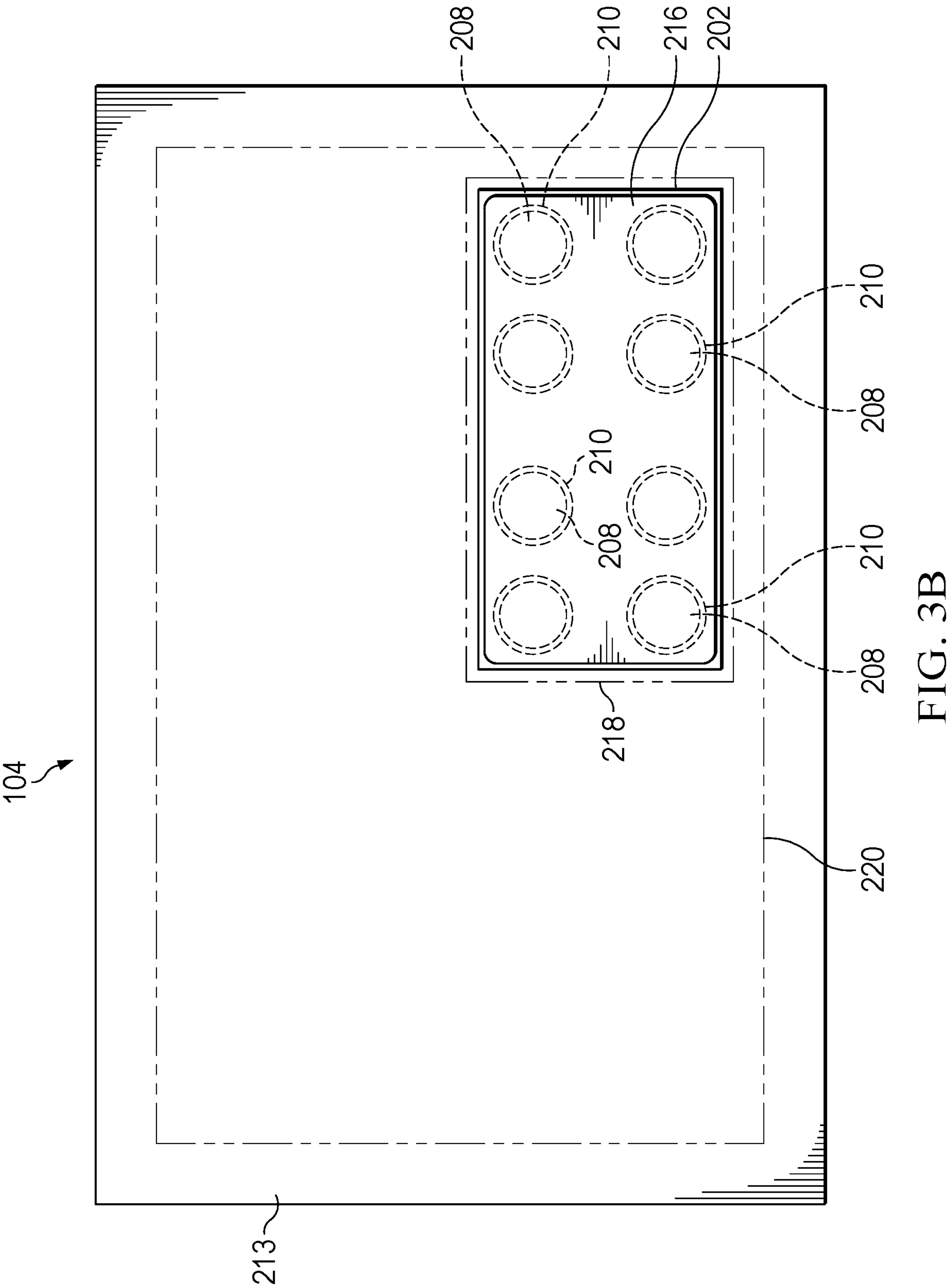
FIG. 3B is a top-down view of a package with structures providing efficient heat dissipation, in accordance with various examples.
Figure 3C:
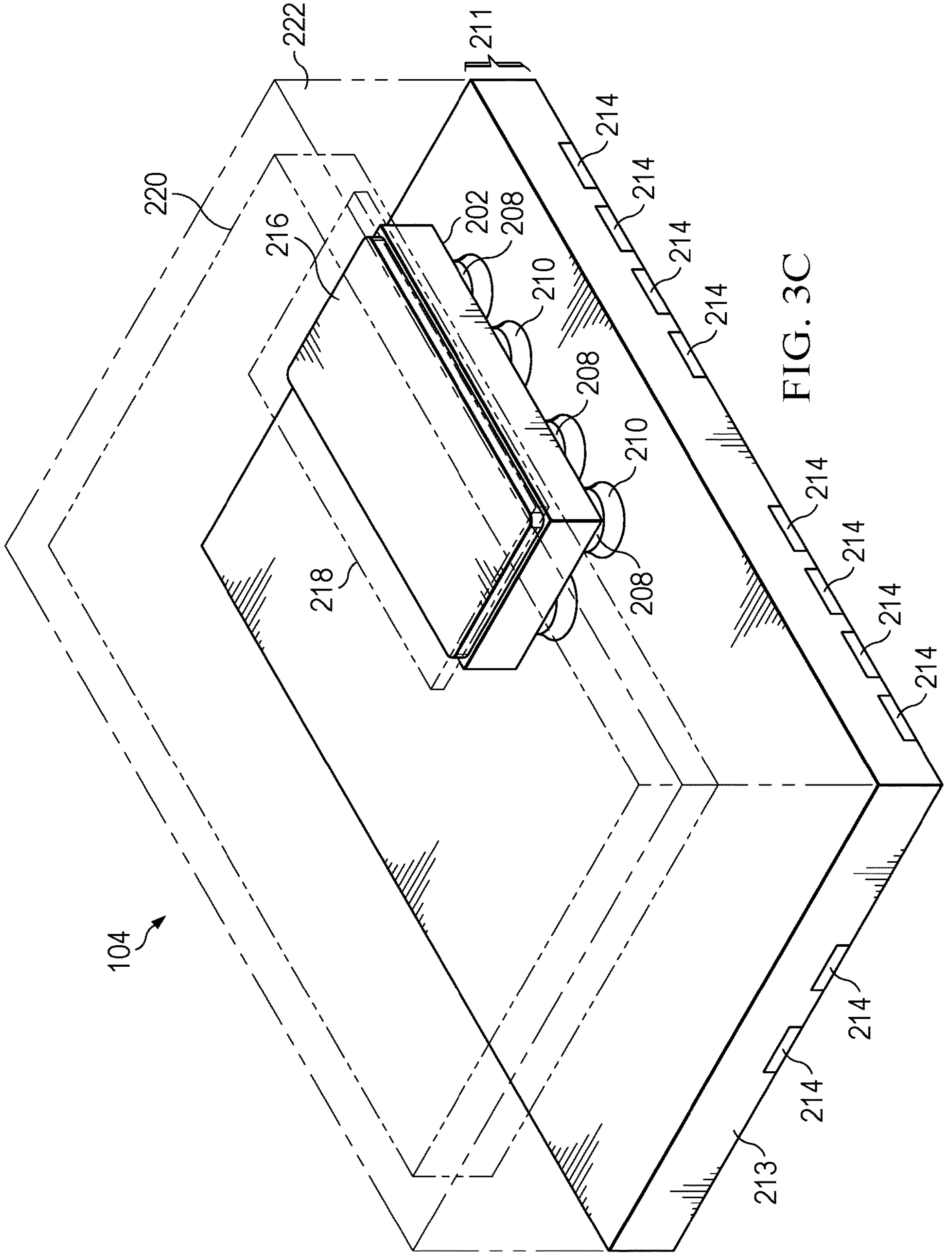
FIG. 3C is a perspective view of a package with structures providing efficient heat dissipation, in accordance with various examples.
Figure 3D:
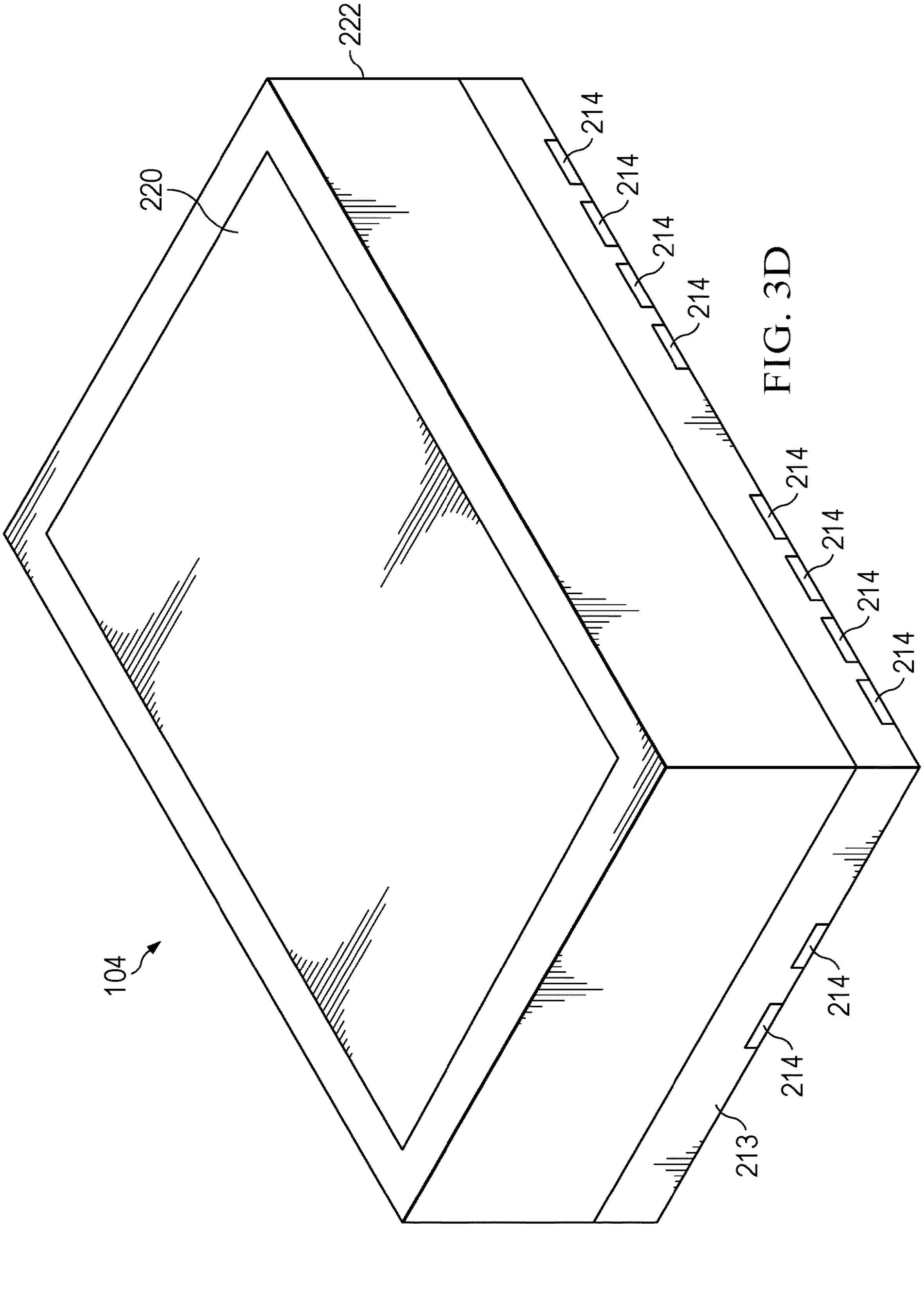
FIG. 3D is another perspective view of a package with structures providing efficient heat dissipation, in accordance with various examples.

FIG. 3B is a top-down view of the semiconductor package 104 of FIG. 3A, in accordance with various examples. FIG. 3C is a perspective view of the semiconductor package 104 of FIG. 3A, in accordance with various examples. FIG. 3D is another perspective view of the semiconductor package 104 of FIG. 3A, in accordance with various examples.

Figure 4:
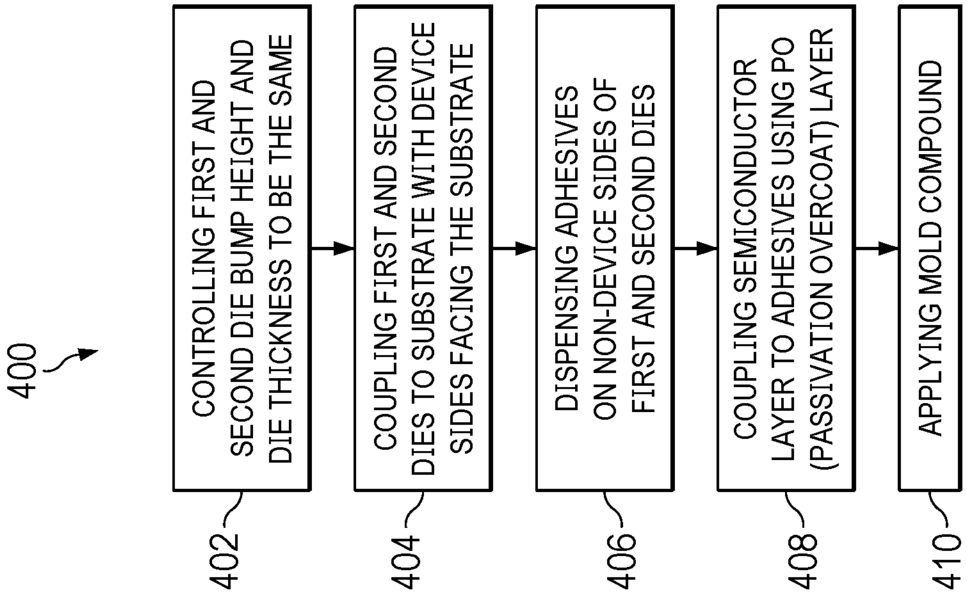
FIG. 4 is a flow diagram of a method for manufacturing a package with structures providing efficient heat dissipation, in accordance with various examples.

FIG. 4 is a flow diagram of a method 400 for manufacturing a package with structures providing efficient heat dissipation (e.g., the example semiconductor packages 104 described above), in accordance with various examples. FIGS. 5A1-5D3 are a process flow for manufacturing a package with structures providing efficient heat dissipation (e.g., the example semiconductor packages 104 described above), in accordance with various examples. Accordingly, FIGS. 4 and 5A1-5D3 are now described in parallel with each other.

The method 400 includes controlling first and second die bump height (e.g., including metal posts and solder bumps) and die thickness to be the same (402). The method 400 also includes coupling first and second dies to a substrate with device sides of the dies facing the substrate (404). More specifically, assuming multiple dies are to be included in a single semiconductor package 104, such as dies 200, 202, the solder bumps 206, 210 may be controlled to be of identical thickness; the metal posts 204, 208 may be controlled to be of identical thickness; and one or more of the dies 200, 202 are grinded so the thicknesses of the dies 200, 202 are also identical. In this way, when the dies 200, 202 are coupled to the substrate 211, the non-device sides (i.e., surfaces) of the dies 200, 202 will be co-planar with each other (i.e., of the same height relative to the top surface of the substrate 211). FIG. 5A1 depicts the dies 200, 202 coupled to the substrate 211 by way of metal posts 204, 208 and solder bumps 206, 210 and having thicknesses of the solder bumps 206, 210, metal posts 204, 208, and dies 200, 202 such that the non-device surfaces of the dies 200, 202 are co-planar. FIG. 5A2 is a top-down view of the structure of FIG. 5A1, in accordance with various examples. FIG. 5A3 is a perspective view of the structure of FIG. 5A1, in accordance with various examples.

The method 400 includes applying adhesives on non-device sides of first and second dies (406). FIG. 5B1 shows the structure of FIG. 5A1, but with adhesive layers 216, 217 applied to the dies 202, 200, respectively. FIG. 5B2 is a top-down view of the structure of FIG. 5B1, in accordance with various examples. FIG. 5B3 is a perspective view of the structure of FIG. 5B1, in accordance with various examples.

The method 400 includes coupling an HDM (e.g., semiconductor layer) to the adhesives using another HDM (e.g., PO layer) (408). FIG. 5C1 shows the structure of FIG. 5B1, except with the HDMs 218, 220 coupled to the adhesive layers 216, 217. In examples, the HDM 218 is applied to the adhesive layers 216, 217, followed by the HDM 220. In other examples, the HDM 218 is coupled to the HDM 220, and then the combined structure of the HDMs 218, 220 is coupled to the adhesive layers 216, 217. FIG. 5C2 is a top-down view of the structure of FIG. 5C1, in accordance with various examples. FIG. 5C3 is a perspective view of the structure of FIG. 5C2, in accordance with various examples.

The method 400 includes applying a mold compound (410). FIG. 5D1 shows the structure of FIG. 5C1, but with the addition of the mold compound 222. The mold compound 222 may be applied using any suitable technique, such as a mold injection technique. The mold compound 222 covers the various structures of the semiconductor package 104 as shown, such as the substrate 211, the metal posts 204, 208, the solder bumps 206, 210, the dies 200, 202, the adhesive layers 216, 217, the HDM 218, and the HDM 220. In examples, the mold compound 222 contacts all surfaces of the HDM 220 except for a top surface of the HDM 220, which is exposed to a top surface of the semiconductor package 104. In examples, the top surface of the HDM 220 is approximately flush with the top surface of the semiconductor package 104. FIG. 5D2 is a top-down view of the structure of FIG. 5D1, in accordance with various examples. FIG. 5D3 is a perspective view of the structure of FIG. 5D1, in accordance with various examples.

Multiple structures like that shown in FIGS. 5D1-5D3 may be linked together during manufacture and singulated after mold compound application. For example, a mechanical or laser saw may be useful to singulate such a structure into individual, completed semiconductor packages 104. To avoid cutting into structures of the semiconductor package 104 that are difficult to cut or that may introduce deleterious mechanical stresses to the semiconductor package 104, the HDMs 218, 220 (and, in some examples, all other structures within the semiconductor package 104 besides the mold compound 222 and insulative material 213) may be distanced from a perimeter of the semiconductor package 104 (i.e., distanced from the sawing location) by a target distance, such as 300 microns in some examples.

Experimental data supports the thermal dissipation efficacy of the semiconductor packages 104 described herein:

| Parameter | Ambient temperature | First die temperature | Second die temperature | Third die temperature |
|---|---|---|---|---|
| Baseline | 55 degrees Celsius | 114.96 degrees Celsius | 101.16 degrees Celsius | 102.61 degrees Celsius |
| Package 104 | 55 degrees Celsius | 99.5 degrees Celsius | 92.8 degrees Celsius | 93.4 degrees Celsius |

As shown, the semiconductor package 104 significantly reduces die temperatures relative to baseline levels in which a package die is exposed to a top surface of a package and coupled to a TIM and heatsink. The semiconductor package 104 reduces thermal resistance by 26%. Consequently, die power can be increased by 26% to improve performance, while maintaining the same die temperatures as the baseline. Alternatively, die size can be reduced by 26%, while maintaining the same die temperatures as the baseline.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

In this description, unless otherwise stated, "about," "approximately" or "substantially" preceding a parameter means being within +/−10 percent of that parameter. Modifications are possible in the described examples, and other examples are possible within the scope of the claims.

What is claimed is:

1. A package, comprising:

a substrate including a conductive member coupled to a conductive terminal, the conductive terminal exposed to an exterior of the package;

a first semiconductor die having first device and first non-device sides, the first device side coupled to the substrate and the first non-device side opposing the first device side, the first device side having circuitry formed therein;

a second semiconductor die having second device and second non-device sides, the second device side coupled to the substrate and the second non-device side opposing the second device side, the second device side having circuitry formed therein;

first and second adhesive layers contacting the first and second non-device sides, respectively;

a passivation overcoat (PO) layer contacting the first and second adhesive layers; and a semiconductor layer contacting the PO layer and exposed to an exterior of the package.

2. The package of claim 1, wherein the PO layer has a thickness ranging between 1 micron and 4 microns.

3. The package of claim 1, further comprising a mold compound covering all surfaces of the semiconductor layer except for a top surface of the semiconductor layer.

4. The package of claim 1, wherein the semiconductor layer comprises silicon nitride or silicon oxide.

5. The package of claim 1, wherein the semiconductor layer has a thermal conductivity of at least 150 Watts per meter-Kelvin.

6. The package of claim 1, wherein the PO layer has an electrical resistivity adequate to electrically isolate the first and second semiconductor dies from each other.

7. The package of claim 1, wherein the first and second adhesive layers are composed of a material selected from the group consisting of an epoxy, solder, and silver sintering material.

8. The package of claim 1, wherein the first semiconductor die is a gallium nitride device configured to control an operation of the second semiconductor die.

9. A package, comprising:

a substrate including a conductive member coupled to a conductive terminal, the conductive terminal exposed to an exterior of the package;

a semiconductor die including a device side facing and coupled to the substrate and a non-device side opposing the device side, the device side having circuitry formed therein;

a first heat dissipation member coupled to the non-device side, having a thickness ranging between 1 micron and 4 microns; and a second heat dissipation member having a bottom surface contacting the first heat dissipation member, multiple lateral surfaces contacting a mold compound, a top surface approximately flush with a top surface of the package, and a thermal conductivity of at least 150 Watts per meter-Kelvin.

10. The package of claim 9, wherein the first heat dissipation member is a passivation overcoat (PO) layer.

11. The package of claim 9, wherein the first heat dissipation member includes one of silicon nitride, silicon oxide, silicon dioxide, polymer films, and silicon oxynitride.

12. The package of claim 9, further comprising the mold compound covering all surfaces of the second heat dissipation member except for a top surface of the second heat dissipation member.

13. The package of claim 9, wherein the second heat dissipation member comprises a semiconductor layer.

14. The package of claim 13, wherein the semiconductor layer comprises silicon nitride or silicon oxide.

15. The package of claim 9, further comprising an adhesive layer between the non-device side of the semiconductor die and the first heat dissipation member, the adhesive layer composed of a material selected from the group consisting of an epoxy, solder, and silver sintering material.

16. The package of claim 9, further comprising a second semiconductor die having a second device side having circuitry formed therein and a second non-device side opposing the second device side, wherein the non-device side and the second non-device side are in horizontal alignment with each other.

17. The package of claim 9, wherein the semiconductor die is a gallium nitride device.

18. A method of manufacturing a package, comprising:

coupling a device side of a semiconductor die to a substrate, the device side having circuitry formed therein, the substrate including a conductive terminal exposed to an exterior of the substrate;

applying an adhesive layer on a non-device side of the semiconductor die opposing the device side of the semiconductor die;

applying a passivation overcoat (PO) layer on the adhesive layer, a semiconductor layer in contact with the PO layer; and covering the substrate, the semiconductor die, the PO layer, and the semiconductor layer with a mold compound, a top surface of the semiconductor layer exposed to a top surface of the mold compound.

19. The method of claim 18, wherein the PO layer has a thickness ranging between 1 micron and 4 microns.

20. The method of claim 18, wherein the PO layer is configured to electrically isolate the semiconductor die.

21. The method of claim 18, wherein the semiconductor layer comprises silicon nitride or silicon oxide.

22. The method of claim 18, wherein the adhesive layer is composed of a material selected from the group consisting of an epoxy, solder, and silver sintering material.

* * * * *